United States Patent
Arango et al.

(10) Patent No.: US 10,043,993 B2
(45) Date of Patent: Aug. 7, 2018

(54) ELECTRO-OPTICAL DEVICE

(75) Inventors: Alexi Arango, Somerville, MA (US);
Vladimir Bulovic, Lexington, MA (US); David Oertel, Hamilton, OH (US); Moungi G. Bawendi, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 242 days.

(21) Appl. No.: 11/768,015

(22) Filed: Jun. 25, 2007

(65) Prior Publication Data
US 2009/0320909 A1  Dec. 31, 2009

(51) Int. Cl.
*H01L 31/00* (2006.01)
*H01L 51/42* (2006.01)
*H01L 51/00* (2006.01)

(52) U.S. Cl.
CPC ........ *H01L 51/426* (2013.01); *H01L 51/0037* (2013.01); *H01L 2251/308* (2013.01); *Y02E 10/549* (2013.01); *Y02P 70/521* (2015.11)

(58) Field of Classification Search
CPC ........................... H01L 51/0037; H01L 31/00
USPC ....................................................... 136/252
See application file for complete search history.

(56) References Cited

U.S. PATENT DOCUMENTS

| | | | |
|---|---|---|---|
| 5,512,131 A | 4/1996 | Kumar et al. | |
| 5,537,000 A * | 7/1996 | Alivisatos et al. | 313/506 |
| 6,180,239 B1 | 1/2001 | Whitesides et al. | |
| 6,291,763 B1 * | 9/2001 | Nakamura | 136/256 |
| 6,322,901 B1 | 11/2001 | Bawendi et al. | |
| 6,518,168 B1 | 2/2003 | Clem et al. | |
| 6,576,291 B2 | 6/2003 | Bawendi et al. | |
| 2004/0023010 A1 * | 2/2004 | Bulovic et al. | 428/209 |
| 2004/0040594 A1 * | 3/2004 | Andriessen | 136/263 |
| 2005/0133087 A1 * | 6/2005 | Alivisatos et al. | 136/263 |
| 2006/0157720 A1 | 7/2006 | Bawendi et al. | |
| 2006/0196375 A1 | 9/2006 | Coe-Sullivan et al. | |
| 2007/0103068 A1 | 5/2007 | Bawendi et al. | |
| 2007/0122101 A1 * | 5/2007 | Buretea et al. | 385/141 |

OTHER PUBLICATIONS

Kim et al., Electrical, Optical, Structural Properties of ITO, Dec. 1999, J Appl. Phys 86 (11).*
Adachi et al., Appl. Phys. Lett., 2001, 78, 1622.
Bulovic et al., Semicond. Semimet., 2000, 64, 255.
Chan et al., App. Phys. Lett., 2004, 85, 2460.
Chan et al., App. Phys. Lett., 2005, 86, 073102.
Dabbousi et al., Chem. Mater., 1994, 6, 216.
Dabbousi et al., J. Phys. Chem. B, 1997, 101, 9463.
Dahan et al., Science, 2003, 302, 442.
Dirr et al., Jpn. J. Appl. Phys., 1998, 37, 1457.
U.S. Appl. No. 11/253,612, filed Oct. 20, 2005, Coe-Sullivan et al.
U.S. Appl. No. 60/550,314, filed Mar. 8, 2004, Steckel et al.
Drndic et al., J. Appl. Phys., 2002, 92, 7498.
Dubertret et al., Science, 2002, 298, 1759.

(Continued)

*Primary Examiner* — Shannon M Gardner
(74) *Attorney, Agent, or Firm* — Steptoe & Johnson LLP

(57) ABSTRACT

An electro-optical device can include a plurality of semiconductor nanocrystals. In some circumstances, the device can omit an electron transporting layer.

9 Claims, 5 Drawing Sheets

(56) References Cited

OTHER PUBLICATIONS

Eisler et al., App. Phys. Lett., 2002, 80, 4614.
Guyot-Sionnest et al., J. Phys. Chem. B, 2003, 107, 7355.
Jaiswal et al., Nat. Biotech., 2003, 21, 47.
Jarosz et al., J. Phys. Chem. B, 2003, 107, 12585.
Kim et al., Nat. Biotech., 2004, 22, 93.
Larson et al., Science, 2003, 300, 1434.
Leatherdale et al., Phys. Rev. B, 2000, 62, 2669.
Parungo et al., Chest, 2005, 127, 1799.
Parungo et al., J. Thor. Cardio. Surg., 2005, 129, 844.
Snee et al., Adv. Mater., 2005, 17, 1131.
Soltesz et al., Ann. Thor. Surg., 2005, 79, 269.
Sundar et al., Adv. Mater., 2002, 14, 739.
Sundar et al., Adv. Mater., 2004, 16, 2137.
Wehrenberg et al., J. Amer. Chem. Soc., 2003, 125, 7806.
Yamasaki et al., Appl. Phys. Lett., 2000, 76, 1243.
Yu et al., Science, 2003, 300, 1277.

\* cited by examiner

ELECTRO-OPTICAL DEVICE

FEDERALLY SPONSORED RESEARCH OR DEVELOPMENT

This invention was made with government support under Contract No. DAAD19-02-D-0002 awarded by the Army Research Office. The government has certain rights in this invention.

TECHNICAL FIELD

The invention relates to an electro-optical device.

BACKGROUND

Electro-optical devices are structures that have electrical properties that change when contacted with electromagnetic radiation, or optical properties that change with application of an electric field. Examples of electro-optical devices include photodetectors, which can be made from materials that generate secondary, rather than primary photocurrents. In a secondary photoconductor, one of the charge carriers is more mobile than the other and cycles through the circuit amplifying the current until it recombines with the slower carrier. In order to observe secondary photocurrents the mobile carrier must be able to be injected from electrodes into the photoconductor.

SUMMARY

In one aspect, an electro-optical device includes a first electrode arranged on a substrate, a layer including a hole transporting material arranged on the first electrode, a layer including a plurality of semiconductor nanocrystals arranged on the layer including the hole transporting material, and a second electrode arranged adjacent to the layer including the plurality of semiconductor nanocrystals.

The second electrode can include a semiconductor material. The second electrode can include indium tin oxide. The layer including a plurality of semiconductor nanocrystals can be substantially free of materials other than semiconductor nanocrystals. The layer including the plurality of semiconductor nanocrystals can be an incomplete layer. The layer including the plurality of semiconductor nanocrystals can have a thickness in the range of 4 nm to 2000 nm, or a thickness of less than 100 nm. The device can be transparent. In some embodiments, the second electrode is in direct contact with the layer including the plurality of semiconductor nanocrystals.

In another aspect, a method of generating current includes exposing a device to an excitation wavelength of light, wherein the device includes a first electrode arranged on a substrate, a layer including a hole transporting material arranged on the first electrode, a layer including a plurality of semiconductor nanocrystals arranged on the layer including the hole transporting material, and a second electrode arranged adjacent to the layer including the plurality of semiconductor nanocrystals.

The method can include applying a voltage across the first electrode and the second electrode. The device can further include a layer including an electron transporting material intermediate the layer including the plurality of semiconductor nanocrystals and the second electrode.

In another aspect, a method of making a device includes arranging a first electrode on a substrate, arranging a layer including a hole transporting material on the first electrode, arranging a layer including a plurality of semiconductor nanocrystals on the layer including the hole transporting material, and arranging a second electrode adjacent to the layer including the plurality of semiconductor nanocrystals.

The method can include connecting the first electrode and the second electrode to a voltage source. At least one of arranging a layer including a hole transporting material and arranging a layer including a plurality of semiconductor nanocrystals on the layer including the hole transporting material can include microcontact printing. Arranging a layer including a plurality of semiconductor nanocrystals on the layer including the hole transporting material can include microcontact printing. Arranging a layer including a hole transporting material and arranging a layer including a plurality of semiconductor nanocrystals on the layer including the hole transporting material can each include microcontact printing.

The details of one or more embodiments are set forth in the description below. Other features, objects, and advantages will be apparent from the description and from the claims.

DETAILED DESCRIPTION

Figure 1A:
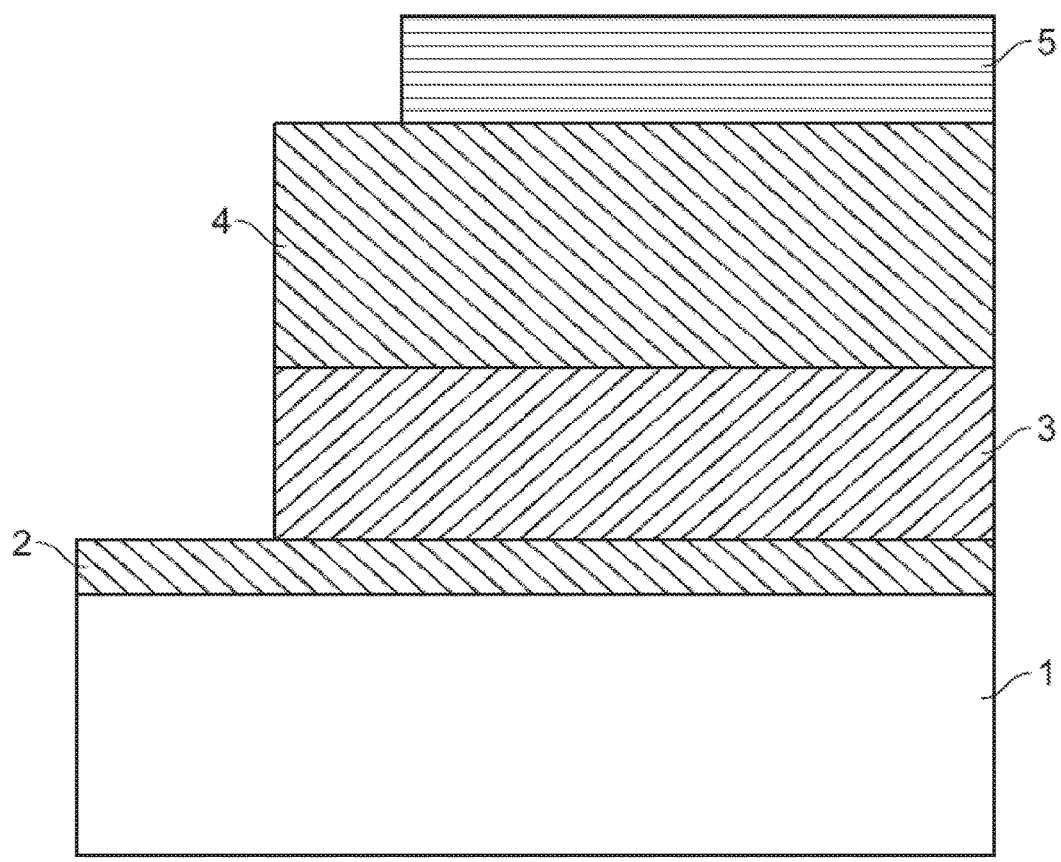
FIGS. 1A-1B are schematic drawings depicting an electro-optical device.

Semiconductor nanocrystals have generated much interest as a potential electro-optical material because of their tunable absorption spectra and because they can be processed in, and deposited from, solution. A nanocrystalline electro-optical device, such as a photodetector or photovoltaic, would work by absorbing light as an exciton which would then be separated into a free electron and hole by an applied electric field. The electron and hole can be moved through the film by the applied field, generating current. However, previous work has shown that nanocrystalline films as deposited can be insulating. The low conductivity is a result of poor exciton separation due to the large distance between nanocrystals in the film. Studies have shown that conductivity of CdSe nanocrystal films can be enhanced by decreasing interparticle spacing through a partial cap exchange of the TOPO capping ligand with a shorter chain amine, such as butylamine. Conductivity in the CdSe nanocrystal films between gold electrodes increased by three orders of magnitude after post-deposition chemically treatment with butylamine. Photocurrent in CdSe nanocrystal thin films with gold electrodes is primary, meaning that the increase of current with voltage plateaus when each electron and hole reaches an electrode and are extracted from the device. This puts a limit on the amount of current which can be generated from a device by increasing the voltage.

Semiconductor nanocrystals (NCs) are fluorescent nanoparticles having a discrete energy structure caused by the confinement of the exciton. The emission from nanocrystals can be tuned by varying their size. Applications for nanocrystals have been demonstrated in a variety of fields ranging from biological imaging to novel lasing devices. See, for example, E. G. Soltesz et al., *The Annals of Thoracic Surgery* 79:269 (2005), Parungo et al., *The Journal of Thoracic and Cardiovascular Surgery* 129:844 (2005), Parungo et al., *Sentinel Lymph Node Mapping of the Pleural Space* 127:1799 (2005), Dahan et al., *Science* 302: 442 (2003), Larson et al., *Science* 300:1434 (2003), Jaiswal et al., *Nature Biotechnology* 21:47 (2003), Dubertret et al., *Science* 298:1759 (2002), Kim et al., *Nature Biotechnology* 22:93 (2004), Eisler et al., *Applied Physics Letters* 80:4614 (2002), Sundar et al., *Advanced Materials* 14:739 (2002), Sundar et al., *Advanced Materials* 16:2137 (2004), Snee et al., *Advanced Materials* 17:1131 (2005), Chan et al., *Applied Physics Letters* 86:073102 (2005), and Chan et al., *Applied Physics Letters* 85:2451 (2004), each of which is incorporated by reference in its entirety. Many of the possible applications for nanocrystals, such as light emitting diodes and photodetectors, involve the transport of charge through films of nanocrystals. Recent research has been directed towards better understanding the electronic conduction in nanocrystal films, not only to engineer better devices, but also from a basic scientific interest in how the movement of charge through a solid built of artificial atoms differs from conduction in a solid composed of natural atoms.

A roadblock in the study of conductance in nanocrystal solids has been the insulating nature of the films. CdSe nanocrystal films have been doped with excess charge in an electrochemical cell and excess charge created with photo-excitation in order to generate currents large enough to study. See, for example, Guyot-Sionnest et al., *Journal of Physical Chemistry B* 107:7355 (2003), Yu et al., *Science* 300:1277 (2003), Wehrenberg et al., *Journal of the American Chemical Society* 125:7806 (2003), Kagan, Thesis Massachusetts Institute of Technology (1996), Leatherdale et al., *Physical Review B* 62, 2669 (2000), and Jarosz et al., *Journal of Physical Chemistry B* 107:12585 (2003), each of which is incorporated by reference in its entirety. The magnitude of the photocurrent has been enhanced by annealing the nanocrystals to decrease interdot spacing and, most recently, by a series of post-deposition chemical treatments which increase surface passivation and also decrease interdot spacing. See, for example, Drndic et al., *Journal of Applied Physics* 92:7498 (2002), which is incorporated by reference in its entirety. The chemical treatments increase the photocurrent by over three orders of magnitude to levels where it saturates with applied field. See, for example, Jarosz et al., *Journal of Physical Chemistry B* 107:12585 (2003), which is incorporated by reference in its entirety. The saturation with a photoconductive gain equal to unity shows that the photocurrent in CdSe nanocrystal films is primary, meaning charge can be extracted but not injected into the photoconductor from the gold electrodes used in the experiments. See, for example, Jarosz et al., *Journal of Physical Chemistry B* 107:12585 (2003), and Bube, *Photoconductivity of Solids*, 1960, New York: Wiley, each of which is incorporated by reference in its entirety. While high photocurrent with no underlying dark current is an ideal characteristic for an application like photodetection, the fact that gold forms a blocking contact with CdSe nanocrystals limits the study of the intrinsic transport properties of the films.

Figure 1B:
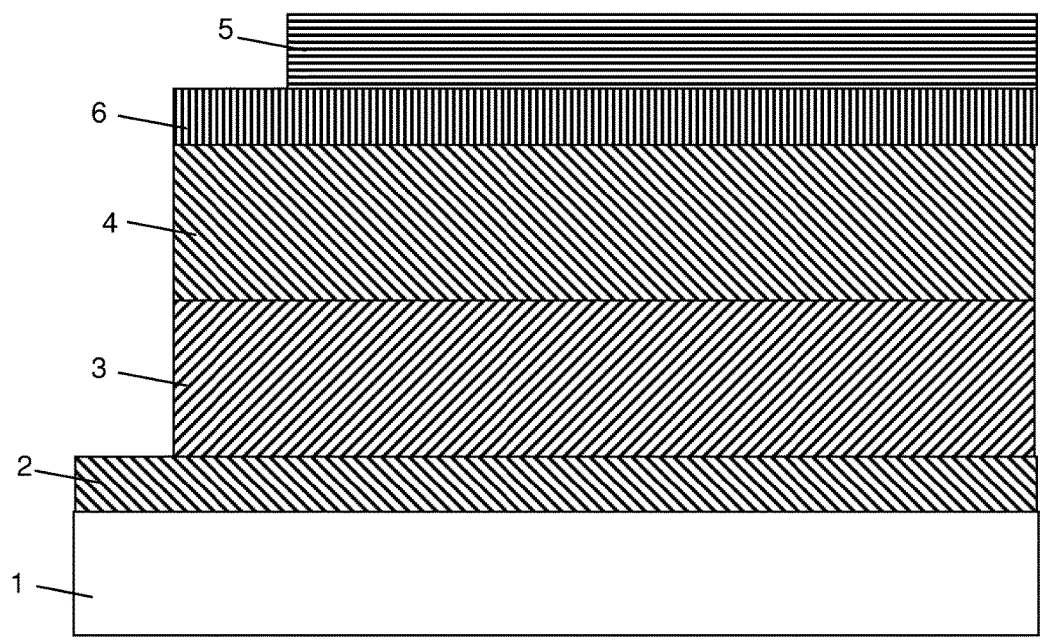

A electro-optical device can have a structure such as shown in FIG. 1A or FIG. 1B, in which a first electrode 2, a first layer 3 in contact with the electrode 2, a second layer 4 in contact with the first layer 3, and a second electrode 5 in contact with the second layer 4. First layer 3 can be a hole transporting layer and second layer 4 can be an electron transporting layer. At least one layer can be non-polymeric. The layers can include an organic or an inorganic material. One of the electrodes of the structure is in contact with a substrate 1. Each electrode can contact a power supply to provide a voltage across the structure. Photocurrent (i.e., electrical current generated in response to absorption of radiation) can be produced by the device when a voltage of proper polarity and magnitude is applied across the layers, and light of appropriate wavelength illuminates the device. Second layer 4 can include a plurality of semiconductor nanocrystals, for example, a substantially monodisperse population of nanocrystals. Optionally, an electron transport layer 6 is located intermediate electrode 5 and second layer 4 (see FIG. 1B).

Alternatively, a separate absorptive layer (not shown in FIG. 1) can be included between the hole transporting layer and the electron transporting layer. The separate absorptive layer can include the plurality of nanocrystals. A layer that includes nanocrystals can be a monolayer of nanocrystals, or a multilayer of nanocrystals. In some instances, a layer including nanocrystals can be an incomplete layer, i.e., a layer having regions devoid of material such that layers adjacent to the nanocrystal layer can be in partial contact. The nanocrystals and at least one electrode have a band gap offset sufficient to transfer a charge carrier from the nanocrystals to the first electrode or the second electrode. The charge carrier can be a hole or an electron. The ability of the electrode to transfer a charge carrier permits the photoinduced current to flow in a manner that facilitates photodetection.

The substrate can be opaque or transparent. The substrate can be rigid or flexible. The first electrode can have a thickness of about 500 Angstroms to 4000 Angstroms. The first layer can have a thickness of about 50 Angstroms to about 5 micrometers, such as a thickness in the range of 100 Angstroms to 100 nm, 100 nm to 1 micrometer, or 1 micrometer to 5 micrometers. The second layer can have a thickness of about 50 Angstroms to about 5 micrometers, such as a thickness in the range of 100 Angstroms to 100 nm, 100 nm to 1 micrometer, or 1 micrometer to 5 micrometers. The second electrode can have a thickness of about 50 Angstroms to greater than about 1000 Angstroms. Each of the electrodes can be a metal, for example, copper, aluminum, silver, gold or platinum, or combination thereof, a doped oxide, such as an indium oxide or tin oxide, or a semiconductor, such as a doped semiconductor, for example, p-doped silicon.

The electron transporting layer (ETL) can be a molecular matrix. The molecular matrix can be non-polymeric. The molecular matrix can include a small molecule, for example, a metal complex. For example, the metal complex can be a metal complex of 8-hydroxyquinoline. The metal complex of 8-hydroxyquinoline can be an aluminum, gallium, indium, zinc or magnesium complex, for example, aluminum tris(8-hydroxyquinoline) ($Alq_3$). Other classes of materials in the ETL can include metal thioxinoid compounds, oxadiazole metal chelates, triazoles, sexithiophene derivatives, pyrazine, and styrylanthracene derivatives. The hole transporting layer can include an organic chromophore. The organic chromophore can be a phenyl amine, such as, for example, N,N'-diphenyl-N,N-bis(3-methylphenyl)-(1,1'-biphenyl)-4,4'-diamine (TPD). The HTL can include a polyaniline, a polypyrrole, a poly(phenylene vinylene), copper phthalocyanine, an aromatic tertiary amine or polynuclear aromatic tertiary amine, a 4,4'-bis(9-carbazolyl)-1,1'-biphenyl compound, or an N,N,N',N'-tetraarylbenzidine. In some cases, the HTL can include more than one hole transporting material, which can be commingled or in distinct layers.

In some embodiments, the device can be prepared without a separate electron transporting layer. In such a device, an absorptive layer which can include semiconductor nanocrystals is adjacent to an electrode. The electrode adjacent to the absorptive layer can advantageously be a semiconductor material that is also sufficiently conductive to be useful as an electrode. Indium tin oxide (ITO) is one suitable material.

The device can be made in a controlled (oxygen-free and moisture-free) environment, which can help maintain the integrity of device materials during the fabrication process. Other multilayer structures may be used to improve the device performance (see, for example, U.S. Patent Application Publication Nos. 2004/0023010 and 2007/0103068, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butyl-phenyl-1,2,4-triazole (TAZ), 3,4,5-triphenyl-1,2,4-triazole, 3,5-bis(4-tert-butylphenyl)-4-phenyl-1,2,4-triazo, bathocuproine (BCP), 4,4',4"-tris {N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

Microcontact printing provides a method for applying a material to a predefined region on a substrate. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

In general, microcontact printing begins by forming a patterned mold. The mold has a surface with a pattern of elevations and depressions. A stamp is formed with a complementary pattern of elevations and depressions, for example by coating the patterned surface of the mold with a liquid polymer precursor that is cured while in contact with the patterned mold surface. The stamp can then be inked; that is, the stamp is contacted with a material which is to be deposited on a substrate. The material becomes reversibly adhered to the stamp. The inked stamp is then contacted with the substrate. The elevated regions of the stamp can contact the substrate while the depressed regions of the stamp can be separated from the substrate. Where the inked stamp contacts the substrate, the ink material (or at least a portion thereof) is transferred from the stamp to the substrate. In this way, the pattern of elevations and depressions is transferred from the stamp to the substrate as regions including the material and free of the material on the substrate. Microcontact printing and related techniques are described in, for example, U.S. Pat. Nos. 5,512,131; 6,180,239; and 6,518,168, each of which is incorporated by reference in its entirety. In some circumstances, the stamp can be a featureless stamp having a pattern of ink, where the pattern is formed when the ink is applied to the stamp. See U.S. Patent Application Publication No. 2006/0196375, which is incorporated by reference in its entirety. Additionally, the ink can be treated (e.g., chemically or thermally) prior to transferring the ink from the stamp to the substrate. In this way, the patterned ink can be exposed to conditions that are incompatible with the substrate.

Typically, a silicon master is first made using standard semiconductor processing techniques which define a pattern on the silicon surface, for example a pattern of elevations and depressions (alternatively, for a non-patterned deposition, a blank Si master can be used). Poly dimethyl siloxane (PDMS, for example Sylgard 184) precursors are then mixed, degassed, poured onto the master, and degassed again, and allowed to cure at room temperature (or above room temperature, for faster cure times). The PDMS stamp, having a surface including the pattern of the silicon master, is then freed from the master, and cut into the desired shape and size. This stamp is then coated with a surface chemistry layer, selected to readily adhere and release the ink as needed. For example, the surface chemistry layer can be a chemical vapor deposited Parylene-C layer. The surface chemistry layer can be, for example, 0.1 to 2 µm thick, depending on the pattern to be reproduced. This stamp is then inked, for example by spin-casting, syringe pump dispensing, or ink jet printing a solution of semiconductor nanocrystals. The solution can have, for example, a concentration of 1-10 mg/mL in chloroform. The concentration can be varied depending on desired outcome. The inked stamp can then be contacted to a substrate, and gentle pressure applied for, for example, 30 seconds to transfer the ink (i.e., a semiconductor nanocrystal layer) completely to the new substrate. The preparation of an ITO coated glass substrate can include thermal evaporation of a hole transport and/or a hole injection layer (HTL and HIL, respectively) including organic semiconductor is onto the ITO substrate. The patterned semiconductor nanocrystal monolayer is transferred to this HTL layer, and the rest of the device (which can include one or more of an electron transport layer (ETL), electron injection layer (EIL), and electrode) can then be added. See, for example, U.S. Patent Application Publication Nos. 2006/0196375, and 2006/0157720, each of which is incorporated by reference in its entirety. Any of the layers of the device can be deposited by microcontact printing.

The outer surface of the nanoparticle includes an outer layer. The outer layer can be derived from the coordinating solvent used during the growth process, or can be applied by ligand exchange. For example, the surface can be modified by exposure (for example, repeated exposure) to an excess of a competing coordinating group. The plurality of nanocrystals on a surface can be exposed to a ligand for the nanocrystal.

Exposing a surface including a plurality of nanocrystals can exchange the ligand for the nanocrystal, which can modify one or more of the optical and electrical properties of a layer including the plurality of nanocrystals. The ligand can be smaller than the ligand on the outer layer, thereby reducing the distance between nanocrystals and altering charge transfer properties in the layer. Alternatively or in addition, heating the layer can alter charge transfer properties in the layer, for example, by annealing the layer or otherwise reducing distances between nanocrystals. The heating conditions are selected to avoid decomposition of the layer or the nanocrystals. For example, the surface can be heated to a temperature of 100° C. or greater, such as 150° C. or greater, 250° C. or less, or about 200° C.

The ligand can be, for example, evaporated or sprayed onto the surface or the device can be dipped into a solution including the ligand. The ligand can be any compound capable of coordinating to or bonding with the outer surface of the nanoparticle, including, for example, phosphines, thiols, amines and phosphates. In certain embodiments, the ligand includes a short hydrocarbon chain, for example, a $C_{2-6}$ alkyl, alkylene, or alkylyne chain. The chain can be optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl. The hydrocarbon chain can also be optionally interrupted by O, S, N(Ra), N(Ra)—C(O)—O, O—C(O)—N(Ra), N(Ra)—C(O)—N(Rb), O—C(O)—O, P(Ra), or P(O)(Ra). Each of Ra and Rb, independently, is hydrogen, alkyl, alkenyl, alkynyl, alkoxy, hydroxylalkyl, hydroxyl, or haloalkyl. In certain embodiments, the ligand is a primary amine, for example, a $C_{2-6}$ alkyl amine such as butyl amine.

The semiconductor nanocrystals can have a broad absorption band with an intense, narrow band emission. The wavelengths of maximum absorbance and emission can be tuned throughout the visible and infrared regions, depending on the size, shape, composition, and structural configuration of the nanocrystals. The nanocrystals can be prepared with an outer surface having desired chemical characteristics (such as a desired solubility). Light emission by nanocrystals can be stable for long periods of time.

When a nanocrystal achieves an excited state (or in other words, an exciton is located on the nanocrystal), emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) for nanocrystals that emit in the visible can be observed. IR-emitting nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. Patent Application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine)selenide (TOPSe) or (tri-n-butylphosphine)selenide (TBPSe), trialkyl phosphine tellurides such as (tri-n-octylphosphine)telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl)phosphide (($TMS)_3P$), tris(trimethylsilyl)arsenide (($TMS)_3As$), or tris(trimethylsilyl)antimonide (($TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The nanocrystal can be a single composition. In certain circumstances, the nanocrystal can have an overcoating on the surface of a core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have the formula:

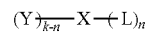

wherein k is 2, 3 or 5, and n is 1, 2, 3, 4 or 5 such that k−n is not less than zero; X is O, S, S=O, $SO_2$, Se, Se=O, N, N=O, P, P=O, As, or As=O; each of Y and L, independently, is aryl, heteroaryl, or a straight or branched $C_{2-12}$ hydrocarbon chain optionally containing at least one double bond, at least one triple bond, or at least one double bond and one triple bond. The hydrocarbon chain can be optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl. The hydrocarbon chain can also be optionally interrupted by —O—, —S—, —N($R^a$)—, —N($R^a$)—C(O)—, —O—C(O)—N($R^a$)—, —N($R^a$)—C(O)—N($R^b$)—, —O—C(O)—O—, —P($R^a$), or —P(O)($R^a$)—. Each of $R^a$ and $R^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, or phenanthryl.

A suitable coordinating ligand can be purchased commercially or prepared by ordinary synthetic organic techniques, for example, as described in J. March, Advanced Organic Chemistry, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Individual devices can be formed at multiple locations on a single substrate to form a photovoltaic array. In some applications, the substrate can include a backplane. The backplane includes active or passive electronics for controlling or switching power to or from individual array elements. Including a backplane can be useful for applications such as displays, sensors, or imagers. In particular, the backplane can be configured as an active matrix, passive matrix, fixed format, directly drive, or hybrid. See, e.g., U.S. patent application Ser. No. 11/253,612, filed Oct. 21, 2005, which is incorporated by reference in its entirety.

The device can be made in a controlled (oxygen-free and moisture-free) environment, preventing the quenching of device efficiency during the fabrication process. Other multilayer structures may be used to improve the device performance.

The performance of light emitting devices can be improved by increasing their efficiency, narrowing or broadening their emission spectra, or polarizing their emission. See, for example, Bulovic et al., *Semiconductors and Semimetals* 64:255 (2000), Adachi et al., *Appl. Phys. Lett.* 78:1622 (2001), Yamasaki et al., *Appl. Phys. Lett.* 76:1243 (2000), Dirr et al., *Jpn. J. Appl. Phys.* 37:1457 (1998), and D'Andrade et al., *MRS Fall Meeting*, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., *J. Phys. Chem.* 101:9463 (1997), which is incorporated by reference in its entirety). A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. The degeneracy of the band edge energy levels of nanocrystals facilitates capture and radiative recombination of all possible excitons, whether generated by direct charge injection, energy transfer, or absorption of light.

A surface including a plurality of nanocrystals can be formed by Langmuir-Blodgett methods (see, Dabbousi et al., *Chemistry of Materials*, 1994:6, which is incorporated by reference in its entirety), evaporative methods, dip coating or spin coating. For example, nanoparticles can be arranged into thin films by spin-casting from solution. While spin-casting is possible for molecular organics, and typical for polymer organics, it limits the available organic matrix materials to those that are highly soluble in solvents such as toluene, hexanes and chloroform, which are the preferred solvents for the TOPO capped nanoparticle colloids. In order to have a large range of possible solution mixtures and film thicknesses, it is necessary to have solubility in the range of 10 mg/mL.

Examples

Figure 2:
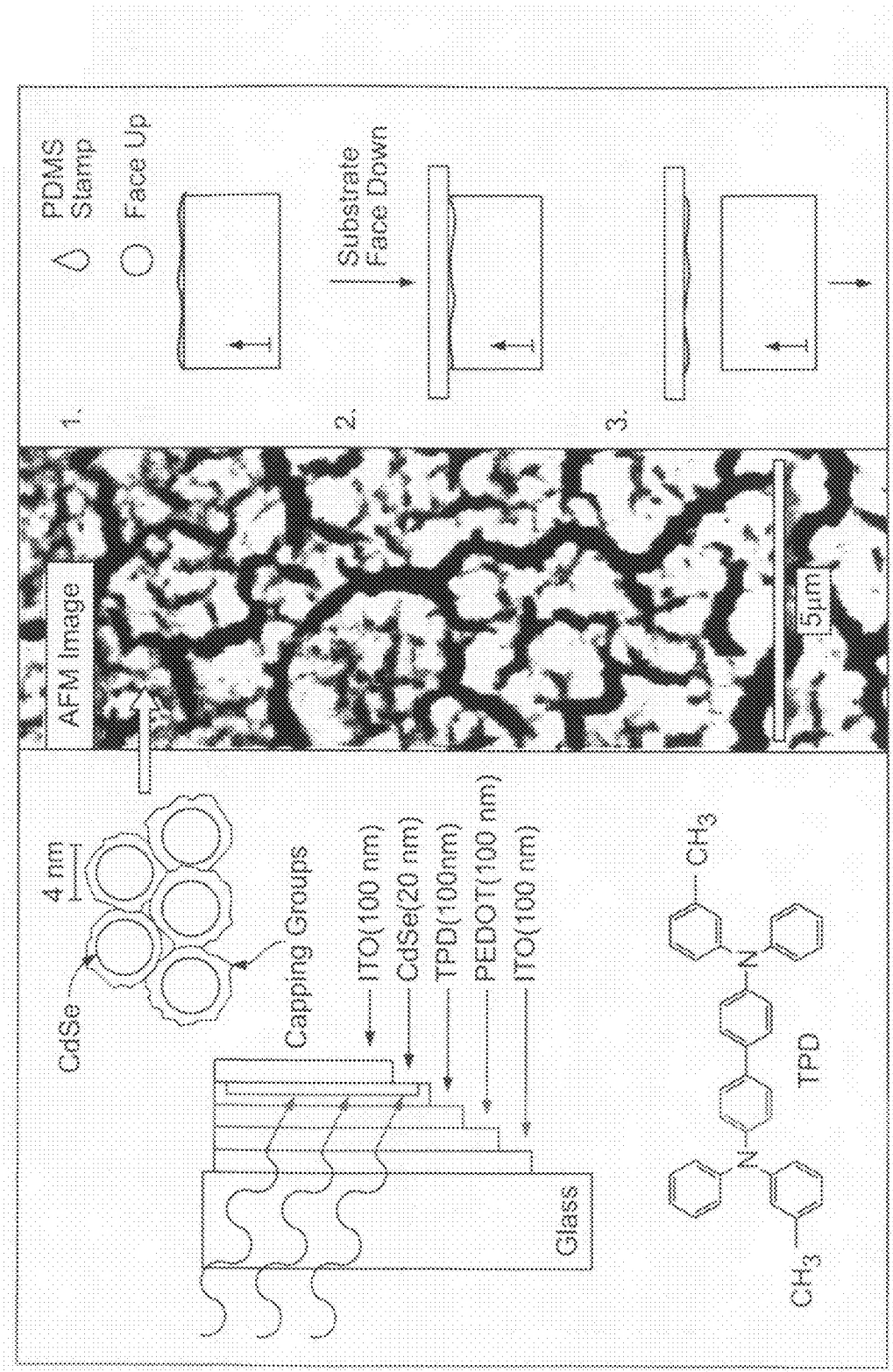
FIG. 2 schematically illustrates an electro-optical device; including an AFM image of a layer of semiconductor nanocrystals prepared by microcontact printing.

FIG. 2 depicts a device structure including a 100 nm film of the wide band gap organic hole-transporting molecule N,N'-diphenyl-N,N'-bis(3-methylphenyl)-(1,1'-biphenyl)-4,4'-diamine (TPD) thermally evaporated or spin coated from solution onto a PEDOT-coated indium tin oxide (ITO) glass substrate. A thin film of cadmium selenide (CdSe) semiconductor nanocrystals was printed onto the TPD film using a polydimethylsiloxane (PDMS) stamp via a non-destructive microcontact method. An ITO top electrode was sputter deposited to complete the device.

Figure 3:
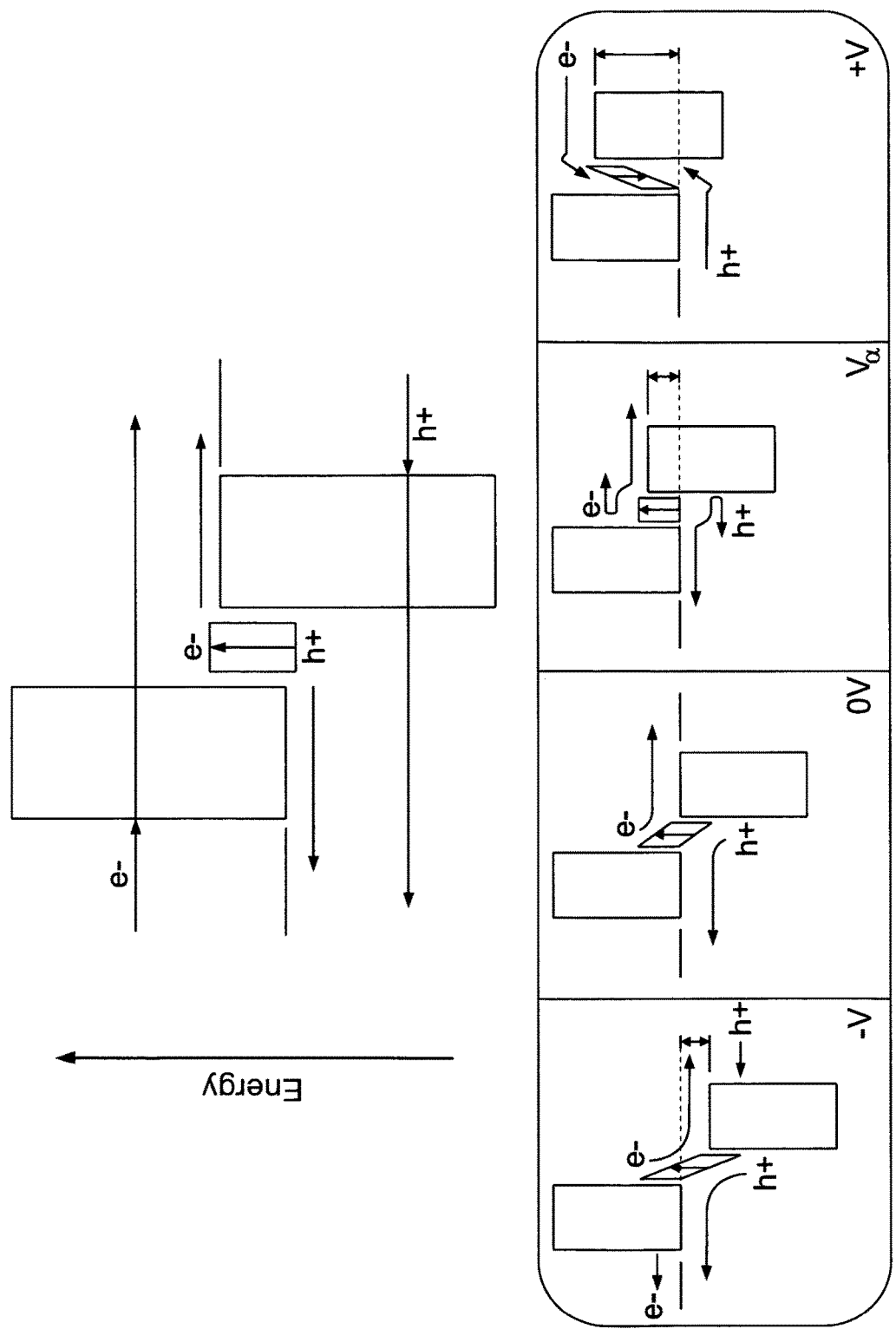
FIG. 3 is a schematic diagram illustrating energy levels of materials in an electro-optical device under different voltage conditions.

Other variations of this device structure can operate similarly. For example, the TPD hole transport layer can be replaced by another small molecule organic layer, conjugated polymer film or metal oxide layer. Additionally, a top electron transport layer can be added intermediate the nanocrystal film and the top electrode. The ETL can similarly include a small molecule organic layer, conjugated polymer film or metal oxide layer. The electron transport material, if any is used, can be selected such that the energy level alignment is favorable for charge transfer from the nanocrystals to the electrodes and that the peripheral charge transport layers prevent charge injection under reverse bias (FIG. 3). In some embodiments, all layers of the device can be printed, enabling a high-throughput process for building up complex structures without damaging underlying the films.

FIG. 3 shows an idealized p-i-n heterojunction energy band diagram with bias dependence. Under reverse bias (bottom left), photogenerated charge is swept away to the contacts, while injected charge is blocked from entering the device. The hole transport layer is on the left side; the electron transport layer is on the right side; and the absorbing nanocrystal film is between the hole transport layer and the electron transport layer.

Figure 4:
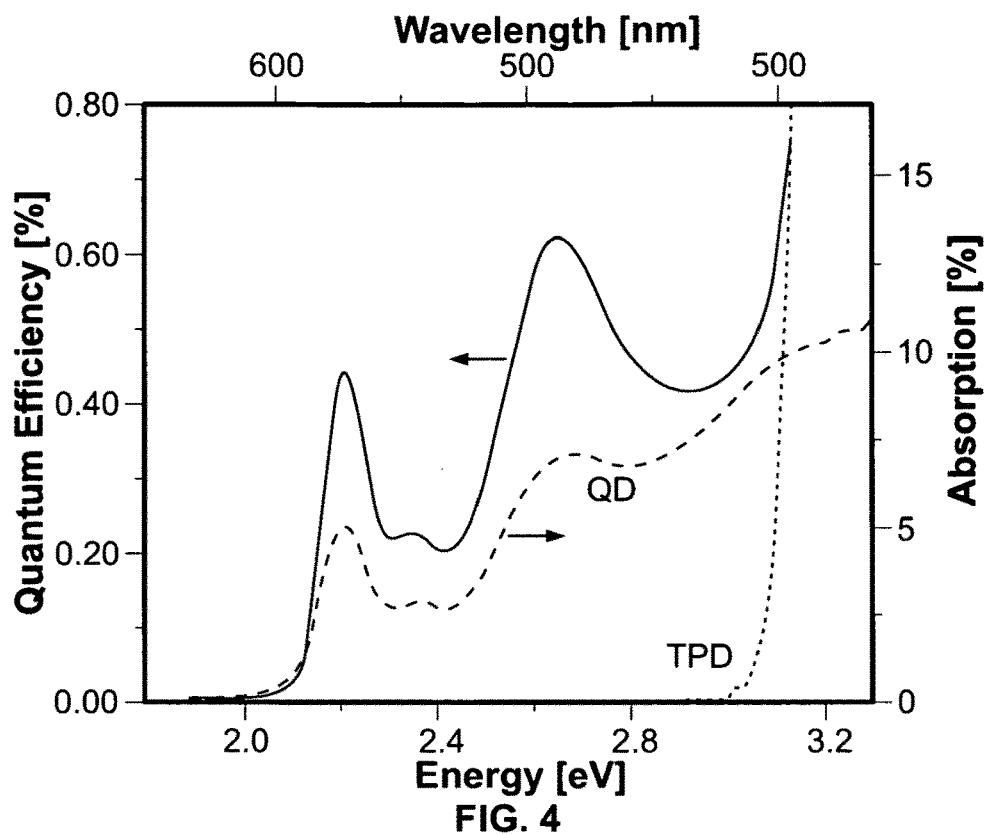
FIG. 4 is a graph depicting optical and electrical properties of an electro-optical device.

The photocurrent spectrum of the photovoltaic device is shown in FIG. 4. The photocurrent spectrum matched the absorption spectrum of the CdSe, indicating that the CdSe dominates absorption and charge generation for incident light having an energy less than 3.0 eV, the absorption threshold of TPD. The magnitude of the external quantum efficiency was 0.45% at the first absorption peak of CdSe. When the absorption of the thin CdSe film was taken into account, the internal quantum efficiency approaches 10%.

Figure 5:
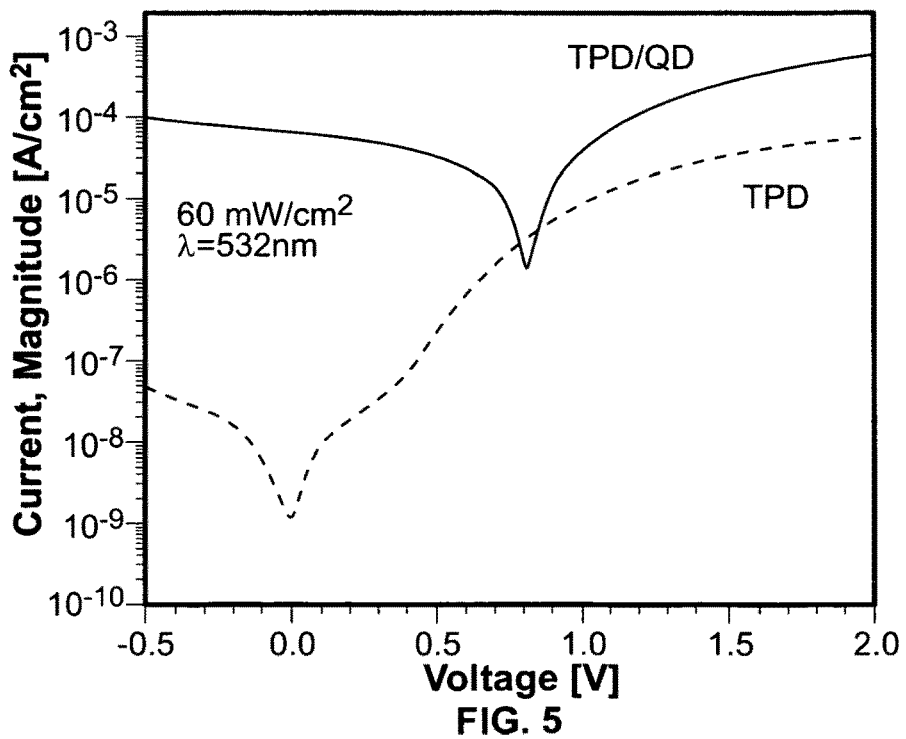
FIG. 5 is a graph depicting electrical properties of an electro-optical device.

The current-voltage characteristics for ITO/PEDOT/TPD (100 nm)/CdSe (20 nm)/ITO (blue) and ITO/PEDOT/TPD (100 nm)/ITO (green) (dashed line, in dark; solid line, under illumination at 532 nm, 60 mW/cm$^2$) are shown in FIG. 5. In reverse bias, the dark current for both devices was low because hole injection is suppressed at the top ITO contact. In forward bias, dark current exhibited sharp turn-on due to hole injection from the PEDOT side. Under additional forward bias, the current became resistance-limited. Upon excitation at 532 nm, the device displayed a modest bias dependent photocurrent and an open circuit voltage of 0.8 V. As forward bias is increased beyond the open circuit voltage, the photocurrent becomes dominated by the background dark current.

Quantum confined systems, such as semiconductor nanocrystals, offer increased absorption compared to bulk semiconductors because of the increased oscillator strength associated with confined exited states or excitons. The absorption coefficient α appears prominently in the equation for the detectivity (D*), a figure of merit for infrared photodetectors:

$$D^* = 0.31 \frac{\lambda}{hc} \sqrt{\frac{\alpha}{G}}$$

where λ is wavelength, h is Planck's constant, c is the speed of light, and G is the carrier generation rate. The absorption coefficient increases by more than two orders of magnitude for bound excitons, yielding an order of magnitude increase in detectivity. However, the generation rate G is largely dependent on the energy level difference between the Fermi level $E_F$ and the conduction band $E_c$ and can be approximated by:

$$G \simeq \frac{N_c}{\tau} \exp \frac{E_F - E_c}{kT}$$

where τ is the carrier lifetime, $N_c$ is the effective density of states in the conduction band, k is Boltzman's constant and T is temperature. Therefore, doping the normally intrinsic quantum dot film can result in a several orders of magnitude gain in performance. Recent results have shown that doping quantum films is indeed possible.

Other embodiments are within the scope of the following claims.

What is claimed is:

1. A photodetector device comprising:
   a first electrode arranged on a substrate;
   a p-i-n heterojunction including a first charge transport layer, a light absorptive layer and a second charge transport layer;
      wherein the first charge transport layer includes more than one different compositions of hole transporting materials arranged on the first electrode;
      wherein the light absorptive layer includes a plurality of semiconductor nanocrystals arranged on the first charge transport layer, the light absorptive layer being substantially free of materials other than semiconductor nanocrystals;
      wherein the second charge transport layer includes an electron transport material arranged on the light absorptive layer;
   and
   a second electrode arranged on the second charge transport layer;
   wherein, under reverse bias, photogenerated charge is transported to the electrodes and the peripheral charge transport layers prevent charge injection, and wherein the second charge transport layer comprising the electron transport material includes a molecular matrix; and
   wherein the electron transport material is selected such that an energy level alignment is favorable for charge transfer from the plurality of semiconductor nanocrystals to the electrodes.

2. The device of claim 1, wherein the second electrode comprises indium tin oxide.

3. The device of claim 2, wherein the layer including a plurality of semiconductor nanocrystals is an incomplete layer.

4. The device of claim 2, wherein the layer including the plurality of semiconductor nanocrystals has a thickness in the range of 4 nm to 2000 nm.

5. The device of claim 4, wherein the layer including the plurality of semiconductor nanocrystals has a thickness in the range of 4 nm to less than 100 nm.

6. The device of claim 1, wherein the device is transparent.

7. A photodetector device comprising:
   a p-i-n heterojunction including a first layer, an absorptive layer and a second layer, wherein the first layer includes more than one different compositions of hole transporting materials arranged on a first electrode;
      wherein the absorptive layer includes a plurality of semiconductor nanocrystals including ligands arranged on the layer including the hole transporting materials, the absorptive layer being substantially free of materials other than the semiconductor nanocrystals including ligands;
      and wherein the first electrode is arranged on a substrate;
   a second electrode; and
   a second layer comprising an electron transport material arranged on the absorptive layer;
   wherein, under reverse bias, photogenerated charge is transported to the electrodes and the peripheral first and second layers prevent charge injection, wherein the second layer comprising the electron transport material includes a molecular matrix;
   wherein the electron transport material is selected such that an energy level alignment is favorable for charge transfer from the plurality of semiconductor nanocrystals to the electrodes.

8. The device of claim 1, wherein the molecular matrix is non-polymeric.

9. The device of claim 1, wherein the hole transporting material includes an organic chromophore.

* * * * *